United States Patent
Lakshmanan et al.

(10) Patent No.: US 7,107,559 B2
(45) Date of Patent: Sep. 12, 2006

(54) METHOD OF PARTITIONING AN INTEGRATED CIRCUIT DESIGN FOR PHYSICAL DESIGN VERIFICATION

(75) Inventors: Viswanathan Lakshmanan, Thornton, CO (US); Richard D. Blinne, Ft. Collins, CO (US); Jonathan P. Kuppinger, Windsor, CO (US)

(73) Assignee: LSI Logic Corporation, Milpitas, CA (US)

( * ) Notice: Subject to any disclaimer, the term of this patent is extended or adjusted under 35 U.S.C. 154(b) by 381 days.

(21) Appl. No.: 10/697,357

(22) Filed: Oct. 29, 2003

(65) Prior Publication Data

US 2005/0097488 A1 May 5, 2005

(51) Int. Cl.
*G06F 17/50* (2006.01)
*G06F 9/45* (2006.01)

(52) U.S. Cl. .............................................. 716/7; 716/5

(58) Field of Classification Search .............. 716/1–18; 703/14, 21, 22; 702/108–126; 718/102–107
See application file for complete search history.

(56) References Cited

U.S. PATENT DOCUMENTS

| | | | | | |
|---|---|---|---|---|---|
| 5,519,628 | A | * | 5/1996 | Russell et al. ................ | 716/10 |
| 5,528,508 | A | * | 6/1996 | Russell et al. ................ | 716/8 |
| 5,768,585 | A | * | 6/1998 | Tetrick et al. ................ | 713/2 |
| 6,289,488 | B1 | * | 9/2001 | Dave et al. .................... | 716/1 |
| 6,378,110 | B1 | * | 4/2002 | Ho ................................ | 716/5 |
| 6,606,735 | B1 | * | 8/2003 | Richardson et al. ........... | 716/5 |
| 6,668,359 | B1 | * | 12/2003 | Fakhry et al. ................. | 716/3 |
| 6,816,997 | B1 | * | 11/2004 | Teh et al. ...................... | 716/5 |
| 2002/0138813 | A1 | * | 9/2002 | Teh et al. ...................... | 716/5 |

\* cited by examiner

*Primary Examiner*—Phallaka Kik
*Assistant Examiner*—Nghia M. Doan
(74) *Attorney, Agent, or Firm*—Eric J. Whitsell

(57) ABSTRACT

A method of partitioning an integrated circuit design for physical design verification includes steps of receiving as input a representation of an integrated circuit design having a number of physical design layers and a composite run deck specifying rule checks to be performed on the integrated circuit design. The composite run deck is partitioned into partitioned run decks so that the number of physical design layers referenced by each of the partitioned run decks is a minimum. The representation of the integrated circuit design is parsed to filter only the physical design layers required for each of the partitioned run decks into a filtered data deck for each of the partitioned run decks. The filtered data deck is generated as output for each of the partitioned run decks.

12 Claims, 3 Drawing Sheets

METHOD OF PARTITIONING AN INTEGRATED CIRCUIT DESIGN FOR PHYSICAL DESIGN VERIFICATION

BACKGROUND OF THE INVENTION

1. Field of the Invention

The present invention relates generally to the design of integrated circuits. More specifically, but without limitation thereto, the present invention relates to methods of partitioning an integrated circuit design into a smaller address space to increase efficiency of physical design verification tools.

2. Description of Related Art

Physical design verification tools are typically run on 32-bit processors and 64-bit processors to verify integrated circuit designs represented by GDS2 files. The 32-bit processors have an address space that can accommodate integrated circuit designs up to 3.5 gigabytes in size, while the 64-bit processors have a larger address space that affords the capability of accommodating integrated designs larger than 3.5 gigabytes.

SUMMARY OF THE INVENTION

In one aspect of the present invention, a method of partitioning an integrated circuit design for physical design verification includes steps of:

(a) receiving as input a representation of an integrated circuit design having a number of physical design layers;
(b) receiving as input a composite run deck specifying rule checks to be performed on the integrated circuit design;
(c) partitioning the composite run deck into partitioned run decks so that the number of physical design layers referenced by each of the partitioned run decks is a minimum;
(d) parsing the representation of the integrated circuit design to filter only the physical design layers required for each of the partitioned run decks into a filtered data deck for each of the partitioned run decks; and
(e) generating as output the filtered data deck for each of the partitioned run decks.

In another aspect of the present invention, a computer program product for partitioning an integrated circuit design for physical design verification includes:

a medium for embodying a computer program for input to a computer; and
a computer program embodied in the medium for causing the computer to perform steps of:
(a) receiving as input a representation of an integrated circuit design having a number of physical design layers;
(b) receiving as input a composite run deck specifying rule checks to be performed on the integrated circuit design;
(c) partitioning the composite run deck into partitioned run decks so that the number of physical design layers referenced by each of the partitioned run decks is a minimum;
(d) parsing the representation of the integrated circuit design to filter only the physical design layers required for each of the partitioned run decks into a filtered data deck for each of the partitioned run decks; and
(e) generating as output the filtered data deck for each of the partitioned run decks.

BRIEF DESCRIPTION OF THE DRAWINGS

The present invention is illustrated by way of example and not limitation in the accompanying figures, in which like references indicate similar elements throughout the several views of the drawings, and in which.

Elements in the figures are illustrated for simplicity and clarity and have not necessarily been drawn to scale. For example, the dimensions of some elements in the figures may be exaggerated relative to other elements to point out distinctive features in the illustrated embodiments of the present invention.

DESCRIPTION OF THE ILLUSTRATED EMBODIMENTS

An important step in the design of integrated circuits is physical design verification, which ensures that all spatial constraints are satisfied for the traces and devices formed in various layers of an integrated circuit die. The structures formed in the several layers of an integrated circuit die are typically represented in a GDS2 (Graphic Data System stream format) file that contains the chip topological information for creating the masks used in manufacturing the integrated circuit dies. The GDS2 format is an industry standard used by commercially available physical verification tools to represent physical design data.

Figure 1:
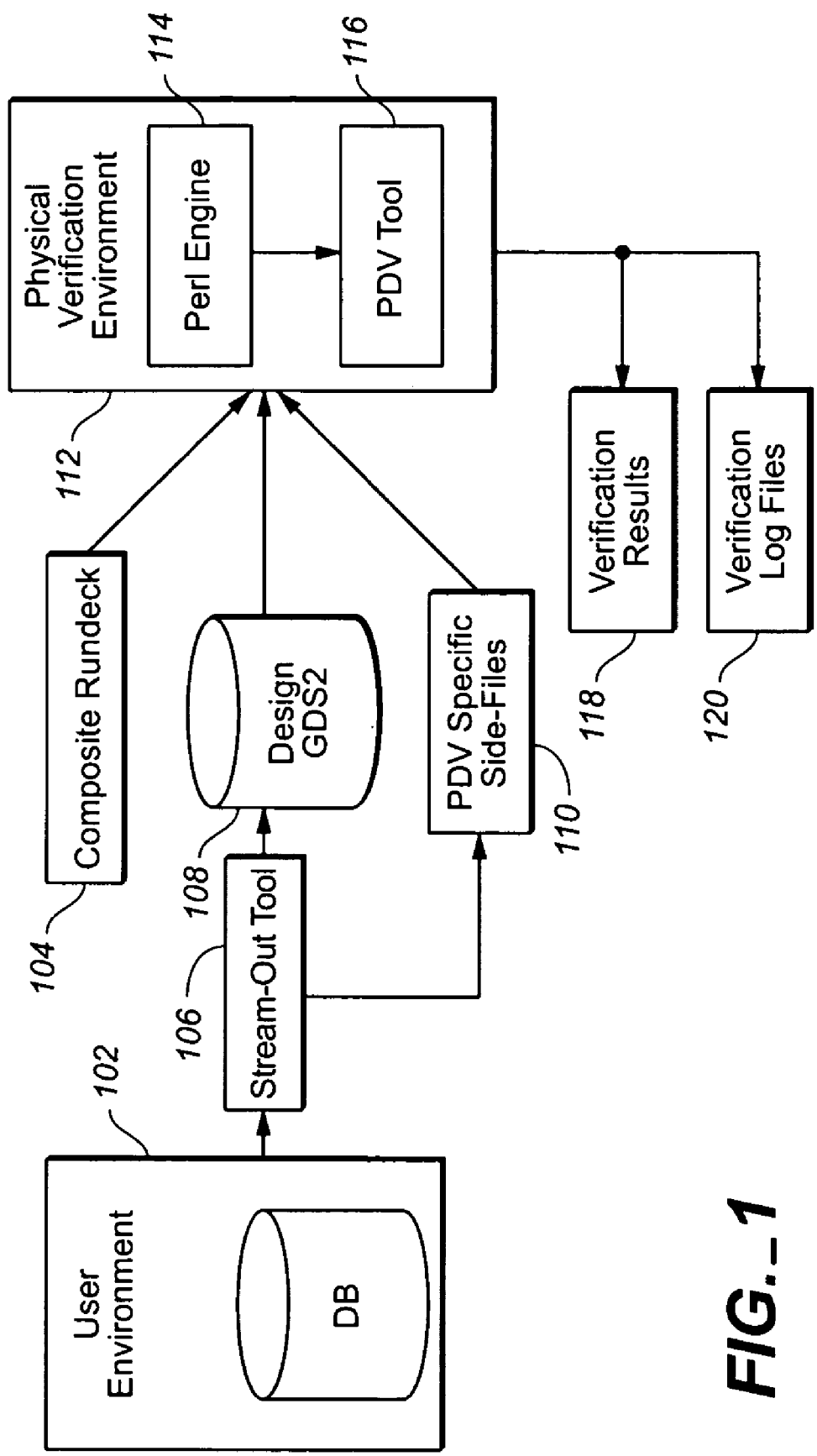
FIG. 1 illustrates a flow diagram of a typical physical design verification process of the prior art.

FIG. 1 illustrates a flow diagram of a typical physical design verification process of the prior art. Shown in FIG. 1 are a user interface 102, a composite run deck 104, a stream-out tool 106, a GDS2 design database 108, physical design verification side files 110, a physical design verification environment 112, a PERL (Practical Extraction and Report Language) engine 114, a physical design verification tool 116, physical design verification results 118, and physical design verification log files 120.

The user interface 102 includes a database of commercially available place and route tools that assist the circuit designer in optimizing placement and routing and to meet the timing constraints for a specific integrated design.

The composite run deck 104 is a file that contains all the rules for verifying an integrated circuit design for a specific technology, for example, a transistor size of 0.18 micron, 0.13 micron or 0.09 micron, and/or layer-stack combination, that is, the number of metal layers used in the design. The metal layers may be used, for example, for connecting the functional blocks in the design, for routing clock nets, for distributing power, and for bonding out to the I/O pads of the chip. The composite run deck 104 is typically a text file that implements the various rule requirements in a rule format such as the Standard Verification Rule Format (SVRF) commonly used by commercially available physical verification tools.

The stream-out tool 106 generates a GDS2 file from the optimized design received from the user interface 102.

The GDS2 design database 108 is the file generated by the stream-out tool 106 that contains the physical representation of the integrated circuit design optimized by the user interface 102. The size of the GDS2 file varies according to the complexity of the integrated circuit design.

The physical design verification side files 110 typically include information such as the name of the GDS2 file, the area or layout window of the physical design, a list of rule checks that are needed to verify the physical design, and other information for performing the verification of the physical design.

The physical design verification environment 112 includes the PERL (Practical Extraction and Report Language) engine 114 and the physical design verification tool 116. The PERL engine 114 parses and processes the composite run deck 104, the GDS2 design database 108, and the physical design verification side files 110 to generate a wrapper file defining the locations of input and output files and the run deck for the physical design verification tool 116. The physical design verification tool 116 may be, for example, a commercially available software program that performs the verification of the physical design on the GDS design database 108 according to the wrapper file generated by the PERL engine 114 to validate the adherence of the integrated circuit design to the rules specified in the composite run deck 104.

The physical design verification results 118 is a file that includes a summary of the rule checks performed on the integrated circuit design and the number of violations detected for each of the rules.

The physical design verification log files 120 detail the locations within the GDS design database 108 of each of the rule violations so that the circuit designer can readily correct problems in an efficient manner.

Disadvantages of using the single composite run deck 104 to verify all the design rules include the long run time required for large GDS2 design files, the inability to use economical processors such as 32-bit LINUX processors for integrated circuit designs larger than 3.5 gigabytes, and the lack of intelligent job-spawning capabilities to partition the rule checking among multiple processors.

It is generally advantageous to run physical design verification tools on processors having a memory bit width of, for example, 32 bits, which are generally faster and less expensive than larger 64-bit processors, however the 32-bit processors are limited to integrated circuit designs of no more than about 3.5 gigabytes in size. The method of the present invention overcomes the address space limitation of the 32-bit processors for integrated designs larger than 3.5 gigabytes by partitioning the integrated circuit design so that physical design verification may be performed by multiple 32-bit processors operating in parallel to reduce turnaround time and processor cost.

In one aspect of the present invention, a method of partitioning an integrated circuit design for physical design verification includes steps of:

(a) receiving as input a representation of an integrated circuit design having a number of physical design layers;

(b) receiving as input a composite run deck specifying rule checks to be performed on the integrated circuit design;

(c) partitioning the composite run deck into partitioned run decks so that the number of physical design layers referenced by each of the partitioned run decks is a minimum;

(d) parsing the representation of the integrated circuit design to filter only the physical design layers required for each of the partitioned run decks into a filtered data deck for each of the partitioned run decks; and (e) generating as output the filtered data deck for each of the partitioned run decks.

Figure 2:
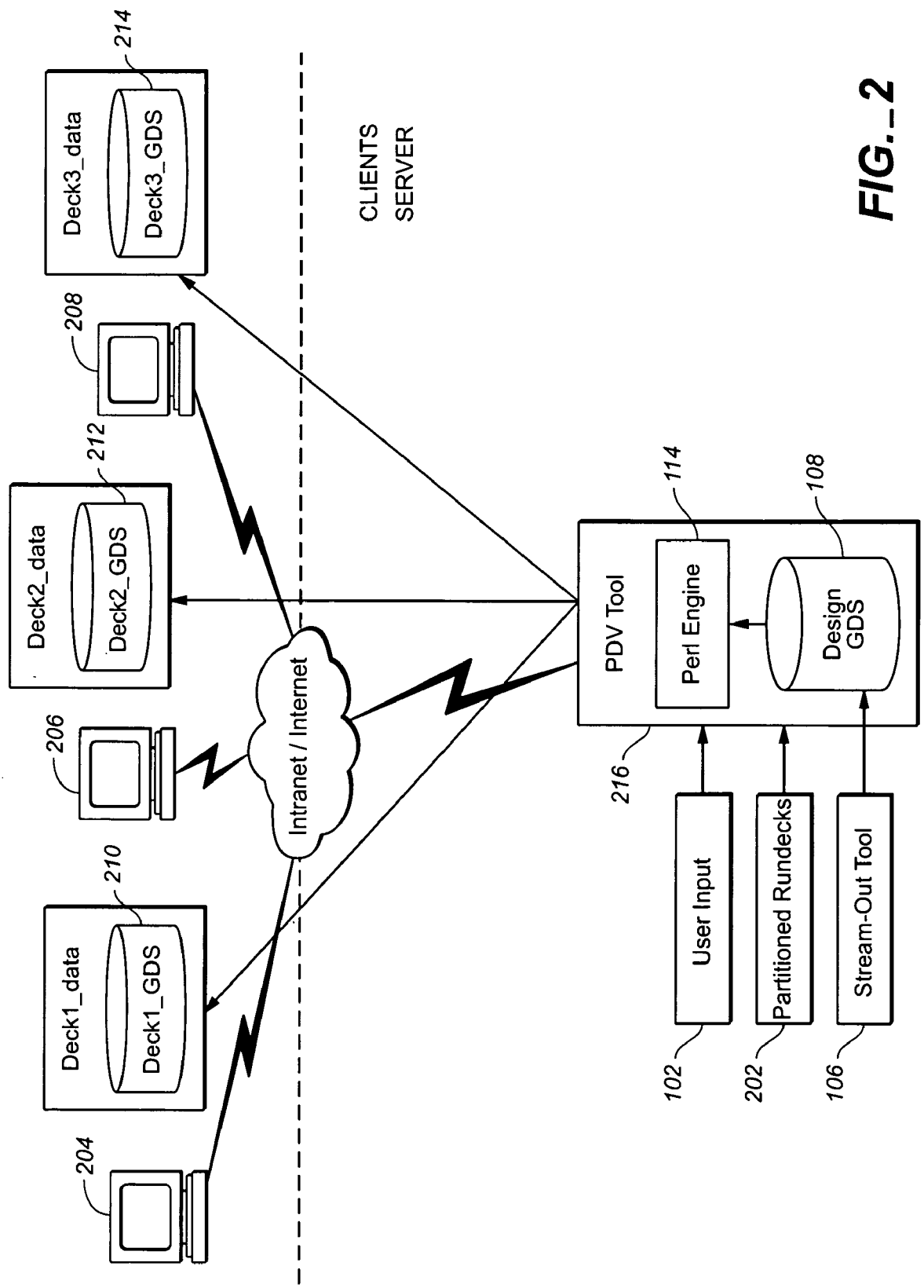
FIG. 2 illustrates a flow diagram of a physical design verification process according to an embodiment of the present invention.

FIG. 2 illustrates a flow diagram of a physical design verification process according to an embodiment of the present invention. Shown in FIG. 2 are a user interface 102, a stream-out tool 106, a GDS2 design database 108, a PERL (Practical Extraction and Report Language) engine 114, partitioned run decks 202, physical verification tool processors 204, 206 and 208, parsed data decks 210, 212 and 214, and a physical design verification tool 216.

The user interface 102 generates inputs for the physical design verification tool 216 for making appropriate decisions for setting up the validation flow, for example, information about the available server farm queues for assigning partitioned run decks as explained in further detail below.

The stream-out tool 106, the GDS2 design database 108, and PERL (Practical Extraction and Report Language) engine 114 may be the same as that described above for FIG. 1.

The partitioned run decks 202 are a partitioning of the composite run deck 104 of FIG. 1. The partitioning is performed by identifying the physical design data that is referenced by each rule check. For example, some of the partitioned run decks 202 are specific to metal layer rules, while others are specific to base layer rules, others to antenna rules, and so on. When the physical design data from the GDS2 design database 108 referenced by each rule check is identified, the composite run deck 104 is partitioned so that so that the number of physical design layers referenced by each of the partitioned run decks 202 is a minimum, thereby ensuring that as many as possible of the partitioned run decks 202 can be run on faster processors having less memory than larger, slower processors. The partitioned run decks 202 allows the GDS file 108 to be parsed into the separate parsed data decks 210, 212 and 214 that may be run in parallel by the physical verification tool processors 204, 206 and 208. An important feature of the design verification process of the present invention is that it is independent of the technology type and the layer/stack combination used in the integrated circuit design.

The physical design verification tool 216 filters the GDS design file 108 into the parsed data decks 210, 212 and 214 corresponding to each of the partitioned run decks 202 so that each of the parsed data decks 210, 212 and 214 contains only the physical design information from the GDS2 design database 108 that is required to perform the physical design verification for each corresponding partitioned run deck 202. The physical design verification tool 216 also assigns each of the parsed data decks 210, 212 and 214 to a queue in a server farm illustrated in this example by the physical verification tool processors 204, 206 and 208. The physical design verification tool 216 uses information received from the user interface 102 to determine the amount of memory available in the physical verification tool processors 204, 206 and 208.

The physical verification tool processors 204, 206 and 208 perform the physical design verification for each of the parsed data decks 210, 212 and 214 in parallel, advantageously reducing the turnaround time previously required for the entire GDS design database 108. and reducing the processor memory requirement so that use of processors having a memory bit width of, for example, 32 bits is maximized. This feature minimizes the resource requirements from slower, larger processors having a bit width of, for example, 64 bits.

Figure 3:
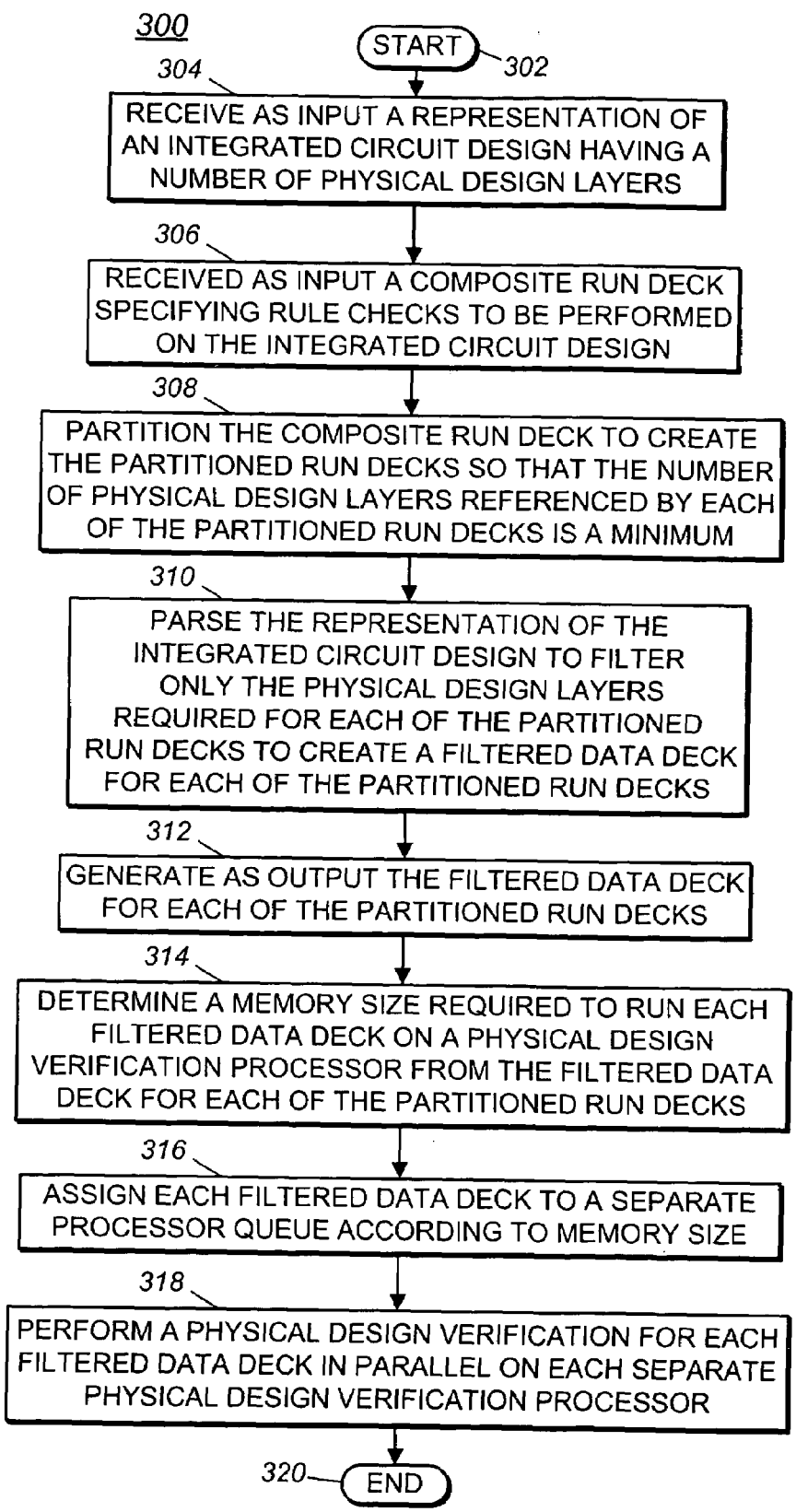
FIG. 3 illustrates a flow chart of a method of partitioning an integrated circuit design for physical design verification according to an embodiment of the present invention.

FIG. 3 illustrates a flow chart 300 of a method of partitioning an integrated circuit design for physical design verification according to an embodiment of the present invention.

Step 302 is the entry point of the flow chart 600.

In step 304, a representation of an integrated circuit design having a number of physical design layers is received as input via the user interface 202 in FIG. 2. In this example, the representation is a GDS2 design database, however, other formats for representing a circuit design may also be used to practice the present invention within the scope of the appended claims.

In step 306, a composite run deck such as the composite run deck 104 in FIG. 1 that specifies the rule checks to be performed on the integrated circuit design is received as input.

In step 308, the composite run deck is partitioned to create the partitioned run decks 202 so that the number of physical design layers referenced by each of the partitioned run decks 202 is a minimum as described above. For example, the composite run deck may be partitioned into eight partitioned run decks 202 based on functionality and layer dependencies associated with the rules in each of the partitioned run decks 202. A sub-directory is created for each of the eight partitioned run decks 202 for spawning off the physical verification process on each of the eight partitioned run decks 202.

The modular character of the partitioned run decks advantageously enhances their maintainability, so that updates may readily be incorporated as needed.

In step 310, the representation of the integrated circuit design is parsed to filter only the physical design layers required for each of the partitioned run decks to create a filtered data deck for each of the partitioned run decks. For example, a metal-2 spacing rule check requires only the metal-2 design data from the GDS2 design file, so the portion of the filtered data deck created for the metal-2 spacing rule check would contain only the metal-2 design data from the GDS2 design file.

In this example, three filtered data decks 210, 212 and 214 are created. Each of the filtered data decks 210, 212 and 214 is a reduced set of the GDS2 design database 108 that includes only the physical design layers required to perform the rule check for each corresponding partitioned run deck without undermining the thoroughness of the validation of the integrated circuit design with respect to each of the rules contained in the partitioned run decks. The filtering of the physical design layers to include only the physical design layers required to perform the rule check for the corresponding partitioned run deck 202 is an important feature of the present invention.

In step 312, the filtered data deck for each of the partitioned run decks is generated as output.

In step 314, a memory size required to run each filtered data deck on a physical design verification processor is determined from the filtered data deck for each of the partitioned run decks. Other resource characteristics such as processor speed and availability may also be weighed for intelligently distributing each filtered data deck to a physical design verification processor.

In step 316, each filtered data deck is assigned to a separate processor queue in a server farm according to the memory size and other resource considerations for each filtered data deck. Typically, the memory size required to run a filtered data deck is less than 3.5 gigabytes, and the physical design verification process for the filtered data deck may be assigned, for example, to a 32-bit LINUX server farm queue. If the size of the filtered data deck GDS2 file exceeds 3.5 gigabytes, then the physical design verification process for the filtered data deck may be assigned, for example, to a 64-bit SOLARIS server farm queue. The 3.5 gigabyte limit is unlikely to be exceeded, however, except for rule checks that require full database connectivity information. Each filtered data deck is accordingly assigned to a separate client processor that may be run concurrently with one other, advantageously reducing the turnaround time for the physical design verification of the entire integrated circuit design. Also, the assignment process may be fully automated to minimize user intervention during the physical design verification process.

In step 318, a physical design verification is performed in parallel for each filtered data deck on each separate physical design verification processor.

Step 320 is the exit point of the flow chart 300.

As may be appreciated from the above, the method of the present invention provides a flexible and robust architecture that can accommodate both in-house and third-party physical design verification tools and can work with a wide variety of computer resources.

Although the method of the present invention illustrated by the flowchart descriptions above are described and shown with reference to specific steps performed in a specific order, these steps may be combined, sub-divided, or reordered without departing from the scope of the claims. Unless specifically indicated herein, the order and grouping of steps is not a limitation of the present invention.

The steps described above with regard to the flow charts described above may also be implemented by instructions performed on a computer according to well-known computer programming techniques.

In another aspect of the present invention, a computer program product for analyzing noise for an integrated circuit design includes:

a medium for embodying a computer program for input to a computer; and a computer program embodied in the medium for causing the computer to perform steps of:

(a) receiving as input a representation of an integrated circuit design having a number of physical design layers;

(b) receiving as input a composite run deck specifying rule checks to be performed on the integrated circuit design;

(c) partitioning the composite run deck into partitioned run decks so that the number of physical design layers referenced by each of the partitioned run decks is a minimum;

(d) parsing the representation of the integrated circuit design to filter only the physical design layers required for each of the partitioned run decks into a filtered data deck for each of the partitioned run decks; and (e) generating as output the filtered data deck for each of the partitioned run decks.

While the invention herein disclosed has been described by means of specific embodiments and applications thereof, numerous modifications and variations could be made thereto by those skilled in the art without departing from the scope of the invention set forth in the following claims.

What is claimed is:

1. A method of partitioning an integrated circuit design for physical design verification including steps of:

(a) receiving as input a representation of an integrated circuit design having a number of physical design layers;

(b) receiving as input a composite run deck specifying rule checks to be performed on the integrated circuit design;

(c) partitioning the composite run deck into partitioned run decks so that the number of physical design layers referenced by each of the partitioned run decks is a minimum;

(d) parsing the representation of the integrated circuit design to filter only the physical design layers required for each of the partitioned run decks into a filtered data deck for each of the partitioned run decks;

(e) generating as output the filtered data deck for each of the partitioned run decks; and (f) determining a memory size required to run each filtered data deck on a physical design verification processor from the filtered data deck for each of the partitioned run decks.

2. The method of claim 1 further comprising a step (g) of assigning each filtered data deck to a separate physical design verification processor according to the required memory size determined for each filtered data deck.

3. The method of claim 2 further comprising a step (h) of performing a physical design verification concurrently for each filtered data deck on each separate physical design verification processor.

4. The method of claim 2 wherein the each separate processor has a memory bit width of one of 32 bits and 64 bits.

5. The method of claim 2 wherein each filtered data deck is assigned to a separate physical design verification processor having a minimum memory bit width required to run the filtered data deck.

6. The method of claim 1 wherein the representation of the integrated circuit design is a Graphic Data System stream format file.

7. A computer program product for partitioning an integrated circuit design for physical design verification comprising:

a medium for embodying a computer program for input to a computer; and a computer program embodied in the medium for causing the computer to perform steps of:

(a) receiving as input a representation of an integrated circuit design having a number of physical design layers; (b) receiving as input a composite run deck specifying rule checks to be performed on the integrated circuit design;

(c) partitioning the composite run deck into partitioned run decks so that the number of physical design layers referenced by each of the partitioned run decks is a minimum;

(d) parsing the representation of the integrated circuit design to filter only the physical design layers required for each of the partitioned run decks into a filtered data deck for each of the partitioned run decks;

(e) generating as output the filtered data deck for each of the partitioned run decks; and (f) determining a memory size required to run each filtered data deck on a physical design verification processor from the filtered data deck for each of the partitioned run decks.

8. The computer program product of claim 7 wherein the steps further comprising a step (g) of assigning each filtered data deck to a separate physical design verification processor according to the required memory size determined for each filtered data deck.

9. The computer program product of claim 8 wherein the steps further comprising a step (h) of performing a physical design verification concurrently for each filtered data deck on each separate physical design verification processor.

10. The computer program product of claim 8 wherein the each separate processor has a memory bit width of one of 32 bits and 64 bits.

11. The computer program product of claim 8 wherein each filtered data deck is assigned to a separate physical design verification processor having a minimum memory bit width required to run the filtered data deck.

12. The computer program product of claim 7 wherein the representation of the integrated circuit design is a Graphic Data System stream format file.

* * * * *